US008729939B2

(12) United States Patent
Hsieh

(10) Patent No.: US 8,729,939 B2
(45) Date of Patent: May 20, 2014

(54) CHARGING/DISCHARGING CIRCUIT AND PLL CIRCUIT USING THE SAME

(71) Applicant: MStar Semiconductor, Inc., Hsinchu County (TW)

(72) Inventor: Yi Chang Hsieh, Hsinchu County (TW)

(73) Assignee: MStar Semiconductor, Inc., Hsinchu (TW)

( * ) Notice: Subject to any disclaimer, the term of this patent is extended or adjusted under 35 U.S.C. 154(b) by 0 days.

(21) Appl. No.: 13/971,963

(22) Filed: Aug. 21, 2013

(65) Prior Publication Data

US 2014/0103975 A1    Apr. 17, 2014

(30) Foreign Application Priority Data

Oct. 17, 2012    (TW) .............................. 101138211 A

(51) Int. Cl.
  *H03L 7/18*    (2006.01)
(52) U.S. Cl.
  USPC .......................................... 327/157; 327/148
(58) Field of Classification Search
  CPC ........ H03L 7/0895; H03L 7/0896; H03L 7/18
  USPC .............................................. 327/148, 157
  See application file for complete search history.

(56) References Cited

U.S. PATENT DOCUMENTS

| 8,049,541 | B2 * | 11/2011 | Haerle ........................ 327/157 |
| 8,330,511 | B2 * | 12/2012 | Raghunathan et al. ....... 327/158 |
| 2005/0242868 | A1 * | 11/2005 | Lutkemeyer .................. 327/298 |
| 2007/0030044 | A1 * | 2/2007 | Lutkemeyer .................. 327/158 |
| 2011/0012653 | A1 * | 1/2011 | Li et al. ........................ 327/157 |
| 2012/0098579 | A1 * | 4/2012 | Schober et al. ............... 327/157 |
| 2012/0242384 | A1 * | 9/2012 | Kato ............................. 327/157 |
| 2013/0099852 | A1 * | 4/2013 | Chen et al. ................... 327/536 |
| 2013/0187691 | A1 * | 7/2013 | Sreekiran ..................... 327/157 |
| 2013/0229213 | A1 * | 9/2013 | Park et al. .................... 327/157 |

* cited by examiner

Primary Examiner — Adam Houston
(74) Attorney, Agent, or Firm — WPAT, PC; Justin King

(57) ABSTRACT

A charging/discharging circuit includes a connection terminal, a reference current providing module, an up current module and a down current module. The down current module includes: a first switch module, having a first control terminal, for receiving the down signal to determine whether the first switch module is turned on; a first bias transistor, having a first terminal coupled to the connection terminal, a second terminal coupled to the first switch module, and a control terminal coupled to the reference current providing module; and a first capacitor simulation transistor, having a first terminal and a second terminal coupled to the control terminal of the first switch module, and a control terminal coupled to the control terminal of the first bias transistor.

34 Claims, 4 Drawing Sheets

US 8,729,939 B2

CHARGING/DISCHARGING CIRCUIT AND PLL CIRCUIT USING THE SAME

This application claims the benefit of Taiwan application Serial No. 101138211, filed Oct. 17, 2012, the subject matter of which is incorporated herein by reference.

BACKGROUND OF THE INVENTION

1. Field of the Invention

The invention relates in general to a charging/discharging circuit and a phase-locked loop (PLL) circuit using the same, and more particularly to a charging/discharging circuit without a capacitor and a PLL circuit using the same.

2. Description of the Related Art

FIG. 1 shows a block diagram of a phase-locked loop (PLL) circuit 100 in the prior art. As shown in FIG. 1, the PLL circuit 100 includes a phase detector 101, a charge pump 103, a loop filter 105 and a voltage-controlled oscillator (VCO) 107. The phase detector 101 compares phases of a reference signal $S_{ref}$ and an output signal $S_{out}$, so as to control the charge pump 103 to charge/discharge the loop filter 105 and to control an output voltage $V_C$ of the loop filter 105. More specifically, the loop filter 105 further includes energy storage elements such as capacitors or inductors. The control voltage $V_C$ is increased when a current for charging the loop filter 105 is provided to the loop filter 105, and alternately the control voltage $V_C$ is reduced when a current for discharging the loop filter 105 is drawn from the loop filter 105.

The VCO 107 receives the control voltage $V_C$ and generates the output signal $S_{out}$. In general, the VCO 107 increases the frequency of the output signal $S_{out}$ as the control voltage $V_C$ rises, and reduces the frequency of the output signal $S_{out}$ as the control voltage $V_C$ lowers. The above design may vary for different circuit designs. Therefore, when the phases of the reference signal $S_{ref}$ and the output signal $S_{out}$ are different, the control voltage $V_C$ can be modified to change the frequency of the output signal $S_{out}$ (thereby also changing the phase of the output signal $S_{out}$). With the above mechanism, the phase of the output signal $S_{out}$ can be synchronized to that of the reference signal $S_{ref}$. On a path from the VCO 107 to the phase detector 101, the PLL circuit 100 may include a frequency divider for adjusting the output signal $S_{out}$. For example, assume that the reference signal $S_{ref}$ is a 100 MHz clock signal, and the frequency range provided by the VCO 107 however does not cover 100 MHz. At this point, the VCO 107 may first generate the output signal $S_{out}$ in a higher frequency of 400 MHz, and the 400 MHz output signal $S_{out}$ is then divided by 4 using the frequency divider. The phase detector 101 next compares the reference signal $S_{ref}$ with the frequency-divided output signal $S_{out}$. As such, the VCO 107 is not required to have an extremely broad frequency range, while the phase detector 101 may also yield a more precise comparison result from comparing two clock signals in lower frequencies.

The charge pump 103 may be implemented in different structures. In one of the structures, a current is provided to the loop filter 105 or drawn from the loop filter 105 according to an up signal or a down signal. As previously described, the control voltage $V_C$ is increased when a current is provided to charge the loop filter 105, and alternately the control voltage $V_C$ is decreased when a current for discharging loop filter 105 is drawn from the loop filter 105. Hence, the control voltage $V_C$ output by the loop filter 105 can be controlled through the above method. More specifically, the phase detector 101 compares the phases of the reference signals $S_{ref}$ and the output signal $S_{out}$ to accordingly generate an up signal UP or a down signal DN. When the up signal UP is received, the charge pump 103 generates an up current $I_{UP}$ for charging the loop filter 105 to further increase the control voltage VC. Conversely, when the down signal DN is received, the charge pump 103 draws a down current $I_{DN}$ from the loop filter 105 to discharge the loop filter 105 and to further decrease the control voltage $V_C$. Thus, the VCO 107 changes the frequency of the output signal $S_{out}$ according to the control voltage $V_C$.

FIG. 2 shows a circuit diagram of a charge pump 200 controlled by an up signal and a down signal in the prior art. As shown in FIG. 2, the charge pump 200 includes a reference current providing module 201, capacitors 203 and 207, switch modules 205 and 209, and bias transistors $BT_1$ and $BT_2$. The capacitor 203, the switch module 205 and the bias transistor $BT_1$ may be collectively regarded as an up current module 204. When an up signal UP turns on the switch module 205, the up current module 204 provides an up current $I_{UP}$ to the loop filter 202. The capacitor 207, the switch module 209 and the bias transistor $BT_2$ may be collectively regarded as a down current module 206. When a down signal DN turns on the switch module 209, the down current module 206 draws a down current $I_{DN}$ from the loop filter 202.

The purpose of the capacitor 203 is to stabilize the supply of the up current $I_{UP}$ and the purpose of capacitor 207 is to stabilize the ability to accept the discharged down current $I_{DN}$. For example, when the down signal DN is at a high level, the switch module 209 is turned on to start drawing the down current $I_{DN}$. However, at the same time, the voltage level to the control terminal of the bias transistor $BT_2$ is also reduced, such that the bias transistor $BT_2$ may no longer allow down current $I_{DN}$ to flow from the loop filter 202 to the switch module. Thus, in the absence of the capacitor 207, after turning on the switch module 209, the bias transistor $BT_2$ may be soon turned off such that the discharging process of the down current $I_{DN}$ is inefficiently performed. Thus, without the capacitor 207, the down current $I_{DN}$ cannot be rapidly drawn from the loop filter 202, leading to a reduced speed in adjusting the control voltage $V_C$ by the loop filter 202. Likewise, the analogous problem would occur to the up current module 204 in the absence of its capacitor 203. Namely, without capacitor 203, up current module 204 cannot rapidly charge loop filter 202 with up current $I_{UP}$ in response to up signal UP. Consequently, the PLL circuit utilizing the charge pump may fail to provide signals of a required phase in a fast and efficient manner without the use of capacitors. The problem is that capacitors occupy a substantial area. More particularly, the area occupied by one capacitor frequently makes up about one-half of the area occupied by the entire charge pump. Thus, in the prior art, the conventional mechanism utilizing fixed capacitors for stabilizing the provision of the up current $I_{UP}$ and the drawing of the down current $I_{DN}$ yields a large-area microelectronic component, which does not satisfy the increasing miniaturization requirements of modern electronic devices.

Therefore, there is a need for a new circuit for solving the above issues.

SUMMARY OF THE INVENTION

The invention is directed to a charging/discharging circuit that replaces the function of a capacitor in a smaller size.

According to an embodiment of the present invention, a charging/discharge circuit is provided. The charging/discharging circuit is for providing an up current to a target element to charge the target element, or drawing a down current from the target element to discharge the target element. The charging/discharging circuit comprises a connection terminal, a reference current providing module, an up current module and a down current module. The down current module comprises: a first switch module, having a control terminal, for receiving the down signal at the control terminal of the first switch terminal to determine whether the first switch module is turned on; a first bias transistor, having a first terminal coupled to the connection terminal, a second terminal coupled to the first switch module, and a control terminal coupled to the reference current providing module; and a first capacitor simulation transistor, having a first terminal and a second terminal coupled to the control terminal of the first switch module, and a control terminal coupled to the control terminal of the first bias transistor.

The above structure of the down current module can be implemented in an up current module.

The present invention further discloses a PLL circuit using the above charging/discharging circuit as a charge pump. Associated details of the structure of can be inferred from the descriptions of the above down current module, and shall be omitted herein.

With the foregoing embodiment, the charging/discharging circuit disclosed by the present invention offers a circuit with benefits of using a capacitor without actually involving a capacitor, thereby remarkably reducing a circuit area while maintaining outstanding charging/discharging efficiency.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2:
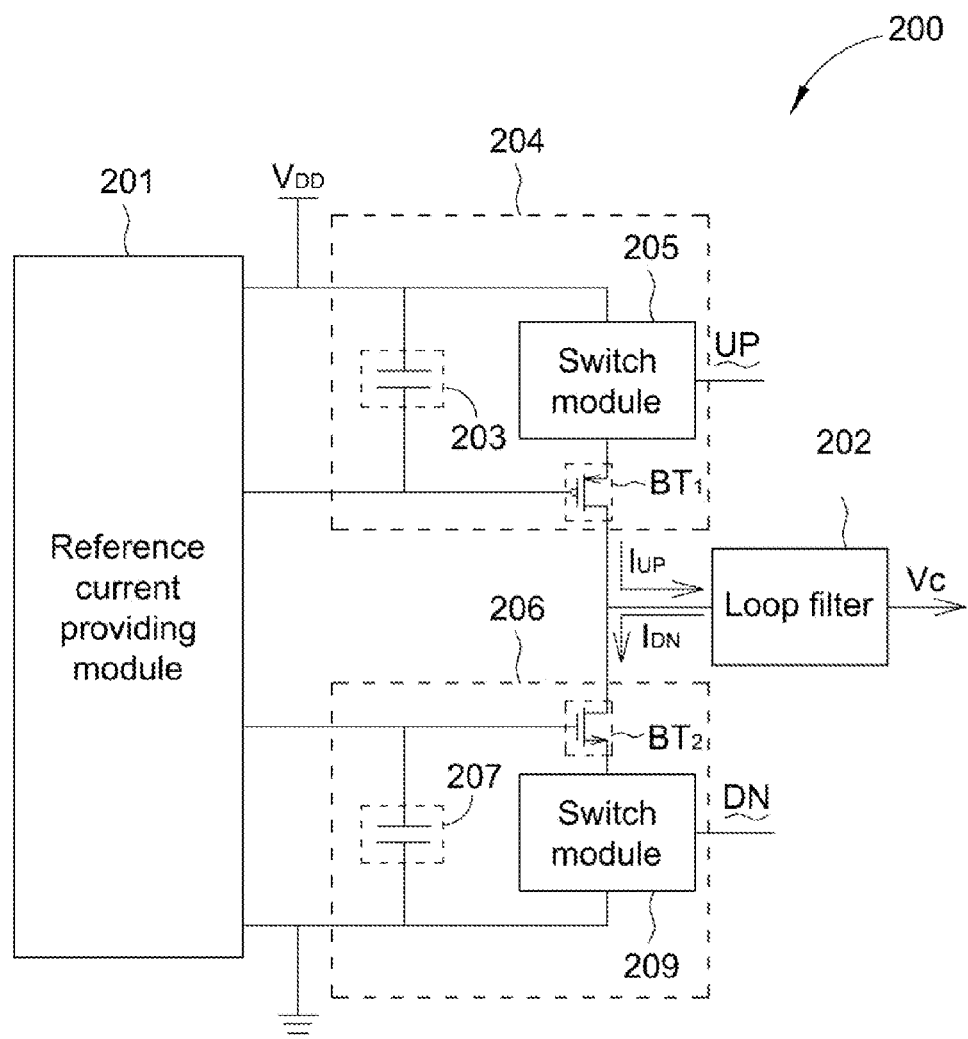
FIG. 2 is a circuit diagram of a charge pump controlled by an up signal and down signal in the prior art.
Figure 3:
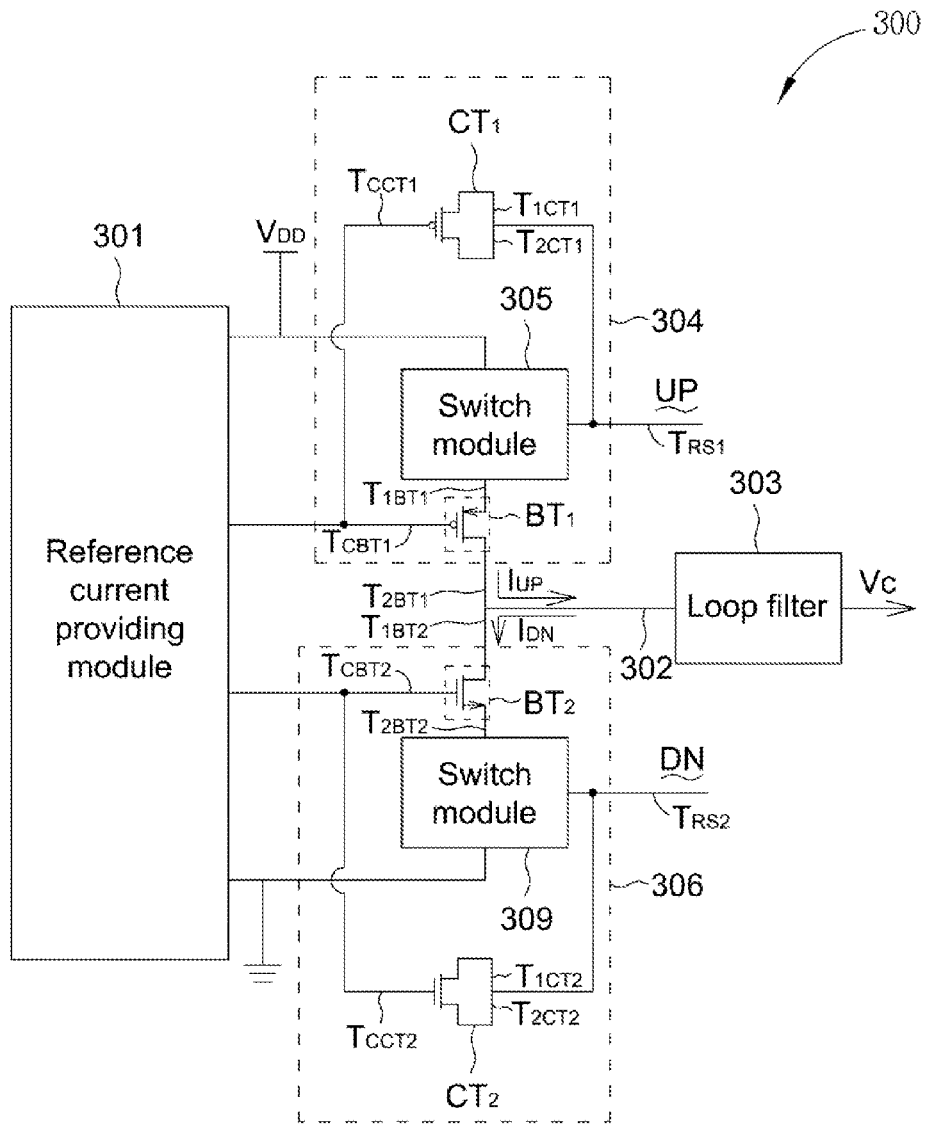
FIG. 3 is a circuit diagram of a charge pump according to an embodiment of the present invention.

Details of a charge pump according to an embodiment of the present invention are described below. FIG. 3 shows a circuit diagram of a charge pump 300 according to an embodiment of the present invention. Compared to the circuit in FIG. 3, the charge pump 300 in FIG. 3 also comprises a reference current providing module 301, an up current module 304 and a down current module 306. The up current module 304 and the down current module 306 are connected to a loop filter 303 via a connection terminal 302. The up current 304 receives an up signal UP at a signal reception terminal $T_{RS1}$, and is controlled by the up signal UP to generate an up current $I_{UP}$ to the loop filter 303. The down current module 306 receives a down signal DN at a signal reception terminal $T_{RS2}$, and is controlled by the down signal DN to draw a down current $I_{DN}$ from the loop filter 303. It should be noted that, elements included in the up current module 304 and the down current module 306 in FIG. 3 are different from the elements included in the up current module 204 and the down current module 206 in FIG. 2. More specifically, the up current module 304 and the down current module 306 in FIG. 3, instead of comprising the capacitor 203 and 207 in the up current module 204 and the down current module 206 in FIG. 2, comprise capacitor simulation transistors $CT_1$ and $CT_2$. In the embodiment, for example, the capacitor simulation transistor $CT_1$ is a P-type metal oxide semiconductor (MOS) transistor and the capacitor simulation transistor $CT_2$ is an N-type MOS transistor. In the description below, the capacitor simulation transistor $CT_1$ is utilized for explaining functions of the capacitor simulation transistors, and the capacitor simulation transistor $CT_2$ has the same functions as the capacitor simulation transistor $CT_1$.

The capacitor simulation transistor $CT_1$ is utilized as a capacitor for assisting in biasing the transistor $BT_2$. For example, when the down signal DN is at a high level, the switch module 309 is turned on. Before the switch module 309 is turned on, the high-level signal is first transmitted via a capacitor formed by the capacitor simulation transistor $CT_1$ to a control terminal $T_{CBT2}$ of the bias transistor $BT_2$. When the switch module 309 is turned on, a transistor in the switch module 309 and the bias transistor $BT_2$ form a new capacitor (to be described in detail with reference to FIG. 4 shortly) to delay the turning off of the bias transistor $BT_2$. Thus, by replacing the original capacitor with the capacitor simulation transistor, an issue of the bias transistor $BT_2$ being quickly turned off in the prior art is eliminated. Further, the area occupied by a transistor is quite small compared to that occupied by a capacitor, and so a circuit area can be effectively reduced through replacing a capacitor by a transistor. In the embodiments in FIGS. 3 and 4, the up current module and the down current module respectively comprise a capacitor simulation transistor. However, in an alternative embodiment, it can also be designed that only one of the up current module and the down current module comprises a capacitor simulation transistor.

Figure 4:
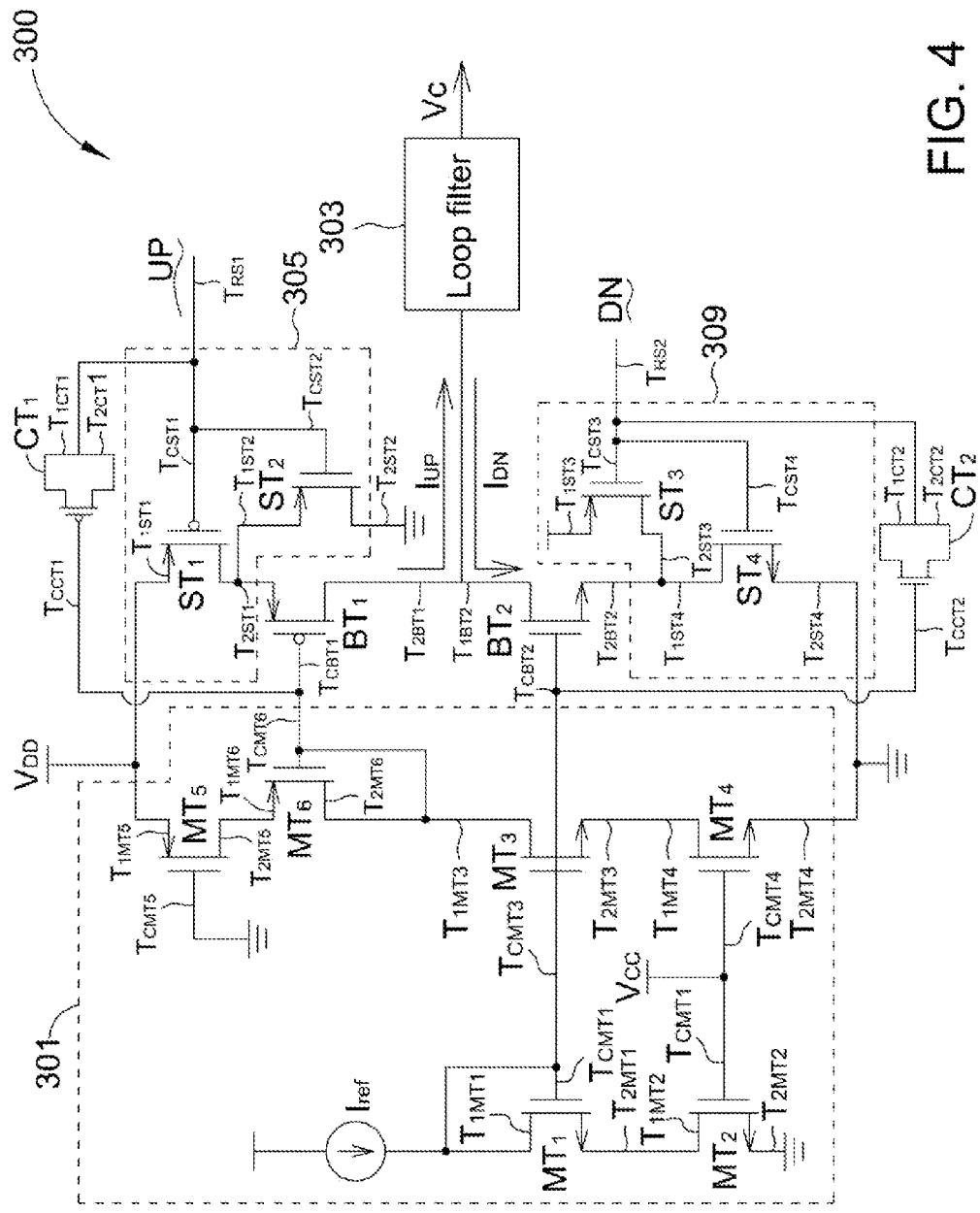
FIG. 4 is a detailed circuit diagram of the charge pump in FIG. 3.

FIG. 4 shows a detailed circuit diagram of the charge pump 300 in FIG. 3.

For simple illustrations, certain denotations in FIG. 3 are not shown in FIG. 4. As shown in FIG. 4, for example, the reference current providing module 301 is a current mirror. The current mirror comprises transistors $MT_1$, $MT_2$, $MT_3$, $MT_4$, $MT_5$ and $MT_6$, and a reference current source $I_{ref}$. The transistors $MT_3$, $MT_4$, $MT_5$ and $MT_6$ respectively map currents generated by the reference current source $I_{ref}$ from paths of the transistors $MT_1$ and $MT_2$ to paths of the transistors $MT_3$, $MT_4$, $MT_5$ and $MT_6$. The bias transistors $BT_1$ and $BT_2$ respectively utilize the currents generated from mapping the reference current source $I_{ref}$ on the paths of the transistors $MT_3$, $MT_4$, $MT_5$ and $MT_6$ as an up current $I_{UP}$ and a down current $I_{DN}$.

In the embodiment in FIG. 4, the switch module 305 comprises two switch elements $ST_1$ and $ST_2$, and the switch module 309 similarly comprises two switch elements $ST_3$ and $ST_4$. The switch element $ST_2$ is for assisting switching operations (turning on/off) of the switch element $ST_1$, and the switch element $ST_3$ is for assisting switching operations of the switch element $ST_4$.

In an embodiment, the capacitor simulation transistor $CT_1$ and the bias transistor $BT_1$ are transistors having the same specifications, and the capacitor simulation transistor $CT_2$ and the bias transistor $BT_2$ are transistors having the same specifications. In an embodiment, the capacitor simulation transistor $CT_1$ and the bias transistor $BT_1$ are both P-type MOS transistors, and the capacitor simulation transistor $CT_2$ and the bias transistor $BT_2$ are both N-type MOS transistors. When the switch module 305 is turned on, the capacitor simulation transistor $CT_1$ operates in a fully turned on state, and the bias transistor $BT_1$ operates in a saturated state. At this point, the bias transistor $BT_1$ may be regarded as a capacitor having a capacitance value of ⅔ of that of the capacitor simulation transistor $CT_1$, and the bias transistor $BT_1$ and the capacitor simulation transistor $CT_1$ are coupled to form a new capacitor. Similarly, the switch module 309 is turned on, the capacitor simulation transistor $CT_2$ operates in a fully turned on state, and the bias transistor $BT_2$ operates in a saturated state. At this point, the bias transistor $BT_2$ may be regarded as a capacitor having a capacitance value of ⅔ of that of the capacitor simulation transistor $CT_2$, and the bias transistor $BT_2$ and the capacitor simulation transistor $CT_2$ are coupled to form a new capacitor. In an alternative embodiment, the capacitor simulation transistor and the bias transistor may also be transistors having different specifications. Therefore, through selecting the size of the capacitor simulation transistor, the capacitance value of the capacitor simulation transistor as well as a required capacitance value of a capacitor formed by the coupled capacitor simulation transistor and bias transistor can be adjusted.

In FIG. 4, a denotation $T_{1XX}$ represents a first terminal of a predetermined transistor or a predetermined switch element, $T_{2XX}$ represents a second terminal of a predetermined transistor or a predetermined switch element, and $T_{CXX}$ represents a control terminal of a predetermined transistor or a predetermined switch element. Thus, referring to FIG. 4, a control terminal $T_{CST2}$ of the switch element $ST_2$ is coupled to a control terminal $T_{SCT1}$ of the switch element $ST_1$, and receives the up signal UP. The first terminal $T_{1ST2}$ of the switch element $ST_2$ is coupled to a first terminal $T_{1ST1}$ of the switch element $ST_1$. Through such denotations, connections between the various elements in the detailed circuit diagram of the charge pump 300 in FIG. 300 can be deduced, and shall be omitted herein.

Figure 1:
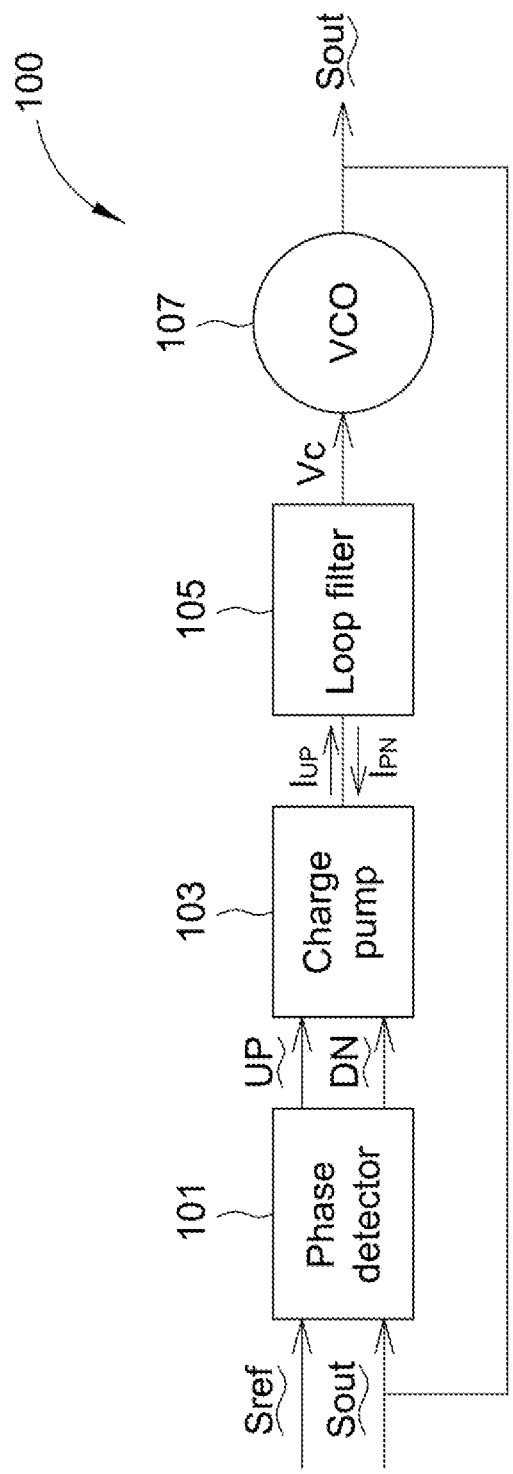
FIG. 1 is a block diagram of a phase-locked loop (PLL) circuit in the prior art.

It should be noted that, in the above embodiments, a charge pump applied in a PLL circuit is illustrated, and so the charge pump 300 in FIGS. 3 and 4 may be utilized in substitution of the charge pump 103 in FIG. 1. However, a charge pump may be regarded as a charging/discharging circuit applicable to other circuits. For example, a charge pump may be applied to a clock and data recovery (CDR) circuit. Therefore, the charge pump disclosed in the embodiments of the present invention may be regarded as a charging/discharging circuit for charging/discharging a target element (e.g., a loop filter in a PLL circuit).

With the foregoing embodiments, the charging/discharging circuit disclosed by the present invention offers a circuit with benefits of a capacitor without actually involving a capacitor, thereby remarkably reducing a circuit area while maintaining outstanding charging/discharging efficiency.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A charging/discharging circuit, for charging/discharging a target element, comprising:
    a connection terminal, coupled to a target element, wherein the charging/discharging circuit provides an up current to the target element via the connection terminal and draws a down current from the target element via the connection terminal;
    a reference current providing module, for providing a reference current;
    an up current module, controlled by an up signal and providing said up current according to said reference current; and
    a down current module, controlled by a down signal and drawing said down current according to said reference current, comprising:
        a first switch module, having a first switch module control terminal for receiving said down signal;
        a first bias transistor, comprising:
            a first bias transistor first terminal, coupled to said connection terminal;
            a first bias transistor second terminal, coupled to said first switch module; and
            a first bias transistor control terminal, coupled to said reference current providing module; and
        a first capacitor simulation transistor, comprising:
            a first capacitor simulation transistor first terminal, coupled to said first switch module control terminal;
            a first capacitor simulation transistor second terminal, coupled to said first switch module control terminal; and
            a first capacitor simulation transistor control terminal, coupled to said first bias transistor control terminal.

2. The charging/discharging circuit according to claim 1, wherein the first switch module comprises:
    a first switch element, comprising:
        a first switch first terminal, coupled to a first predetermined voltage;
        a first switch second terminal, coupled to said first bias second terminal; and
        a first switch control terminal, receiving said down signal; and
    a second switch element, comprising:
        a second switch first terminal, coupled to said first switch second terminal;
        a second switch second terminal, coupled to a second predetermined voltage; and
        a second switch control terminal coupled to said first switch control terminal and receiving said down signal.

3. The charging/discharging circuit according to claim 1, wherein said first capacitor simulation transistor is in a fully turned on state when said first switch module is turned on by said down signal.

4. The charging/discharging circuit according to claim 1, wherein said first bias transistor and said first capacitor simulation transistor have the same transistor specifications.

5. The charging/discharging circuit according to claim 1, wherein said first bias transistor is an N-type metal oxide semiconductor (MOS) transistor and said first capacitor simulation transistor is an N-type metal oxide semiconductor (MOS) transistor.

6. The charging/discharging circuit according to claim 1, wherein said reference current providing module is a current mirror, and said first bias transistor utilizes said reference current mapped from said reference current providing module as said down current.

7. The charging/discharging circuit according to claim 1, wherein said up current module comprises:
    a second switch module, having a second switch module control terminal coupled to said second switch control terminal for receiving said up signal;
    a second bias transistor, comprising:
        a second bias transistor first terminal, coupled to said connection terminal;
        a second bias transistor second terminal, coupled to said second switch module; and
        a second bias transistor control terminal, coupled to said reference current providing module; and a second capacitor simulation transistor, comprising:
  a second capacitor simulation transistor first terminal, coupled to said second switch module control terminal;
  a second capacitor simulation transistor second terminal, coupled to said second switch control terminal; and
  a second capacitor simulation transistor control terminal, coupled to said second bias control terminal.

8. The charging/discharging circuit according to claim 7, wherein said second switch module comprises:
  a first switch element, comprising:
    a first switch second terminal, coupled to a first predetermined voltage;
    a first switch first terminal, coupled to said second bias second terminal; and
    a first switch control terminal, receiving said up signal; and
  a second switch element, comprising:
    a second switch second terminal, coupled to said first switch first terminal;
    a second switch first terminal, coupled to a second predetermined voltage; and
    a second switch control terminal, coupled to said first switch control terminal and receiving said up signal.

9. The charging/discharging circuit according to claim 7, wherein said second capacitor simulation transistor is in a fully turned on state when said second switch module is turned on by said up signal.

10. The charging/discharging circuit according to claim 7, wherein said second bias transistor and said second capacitor simulation transistor have same transistor specifications.

11. The charging/discharging circuit according to claim 7, wherein said second bias transistor is a P-type metal oxide semiconductor (MOS) transistor, and said second capacitor simulation transistor is a P-type metal oxide semiconductor (MOS) transistor.

12. A charging/discharging circuit, for charging/discharging a target element, comprising:
  a connection terminal, coupled to a target element, wherein the charging/discharging circuit provides an up current to the target element via the connection terminal and draws a down current from the target element via the connection terminal;
  a reference current providing module, for providing a reference current;
  a down current module, controlled by a down signal and drawing said down current according to said reference current; and
  an up current module, controlled by an up signal and providing said up current according to said reference current, comprising:
    a switch module, having a switch module control terminal for receiving said up signal;
    a bias transistor, comprising:
      a bias transistor first terminal, coupled to said connection terminal;
      a bias transistor second terminal, coupled to said switch module; and
      a bias transistor control terminal, coupled to said reference current providing module; and
    a capacitor simulation transistor, comprising:
      a capacitor simulation transistor first terminal, coupled to said switch module control terminal;
      a capacitor simulation transistor second terminal, coupled to said switch module control terminal; and
      a capacitor simulation transistor control terminal, coupled to said bias control terminal.

13. The charging/discharging circuit according to claim 12, wherein said switch module comprises:
  a first switch element, comprising:
    a first switch second terminal, coupled to a first predetermined voltage;
    a first switch first terminal, coupled to said bias second terminal; and
    a first switch control terminal, receiving said up signal; and
  a second switch element, comprising:
    a second switch second terminal, coupled to said first switch first terminal;
    a second switch first terminal, coupled to a second predetermined voltage; and
    a second switch control terminal, coupled to said first switch control terminal and receiving said up signal.

14. The charging/discharging circuit according to claim 12, wherein said capacitor simulation transistor is in a fully turned on state when said switch module is turned on by said up signal.

15. The charging/discharging circuit according to claim 12, wherein said bias transistor and said capacitor simulation transistor have the same transistor specifications.

16. The charging/discharging circuit according to claim 12, wherein said bias transistor is a P-type metal oxide semiconductor (MOS) transistor, and said capacitor simulation transistor is a P-type metal oxide semiconductor (MOS) transistor.

17. The charging/discharging circuit according to claim 12, wherein said reference current providing module is a current mirror, and said bias transistor utilizes said reference current mapped from said reference current providing module as said up current.

18. A phase-locked loop (PLL) circuit, comprising:
  a phase detector, for comparing phases of a reference signal and an output signal to generate an up signal or a down signal;
  a loop filter;
  a charge pump, for charging or discharging said loop filter such that said loop filter generates a control voltage, generating an up current to charge said loop filter when receiving said up signal, and drawing a down current from said loop filter to discharge said loop filter when receiving said down signal; and
  a voltage-controlled oscillator (VCO), receiving said control voltage to generate said output signal;
  wherein, said charge pump comprises:
    a connection terminal, coupled to said loop filter, wherein the charging/discharging circuit provides said up current to said loop filter via the connection terminal and draws said down current from said loop filter via the connection terminal;
    a reference current providing module, for providing a reference current;
    an up current module, controlled by said up signal and providing said up current according to said reference current; and
    a down current module, controlled by said down signal and drawing said down current according to said reference current, comprising:
      a first switch module, having a first switch module control terminal, receiving said down signal at the first switch module control terminal;

a first bias transistor, comprising:
  a first bias transistor first terminal, coupled to said connection terminal;
  a first bias transistor second terminal coupled to said first switch module; and
  a first bias transistor control terminal, coupled to said reference current providing module; and
a first capacitor simulation transistor, comprising:
  a first capacitor simulation transistor first terminal, coupled to said first switch module control terminal;
  a first capacitor simulation transistor second terminal, coupled to said first switch module control terminal; and
  a first capacitor simulation transistor control terminal coupled to said first bias control terminal.

19. The PLL circuit according to claim 18, wherein the first switch module comprises:
  a first switch element, comprising:
    a first switch first terminal, coupled to a first predetermined voltage;
    a first switch second terminal, coupled to said first bias second terminal; and
    a first switch control terminal, receiving said down signal; and
  a second switch element, comprising:
    a second switch first terminal, coupled to said first switch second terminal;
    a second switch second terminal, coupled to a second predetermined voltage; and
    a second switch control terminal coupled to said first switch control terminal and receiving said down signal.

20. The PLL circuit according to claim 18, wherein said first capacitor simulation transistor is in a fully turned on state when said first switch module is turned on by said down signal.

21. The PLL circuit according to claim 18, wherein said first bias transistor and said first capacitor simulation transistor have same transistor specifications.

22. The PLL circuit according to claim 18, wherein said first bias transistor is an N-type metal oxide semiconductor (MOS) transistor, and said first capacitor simulation transistor is an N-type metal oxide semiconductor (MOS) transistor.

23. The PLL circuit according to claim 18, wherein said reference current providing module is a current mirror, and said first bias transistor utilizes said reference current mapped from said reference current providing module as said down current.

24. The PLL circuit according to claim 18, wherein said up current module comprises:
  a second switch module, having a second switch module control terminal receiving said up signal at said second switch module control terminal to determine whether the second switch module is turned on;
  a second bias transistor, comprising:
    a second bias transistor first terminal coupled to said connection terminal;
    a second bias transistor second terminal, coupled to said second switch module; and
    a second bias transistor control terminal, coupled to said reference current providing module; and
  a second capacitor simulation transistor, comprising:
    a second capacitor simulation transistor first terminal, coupled to said second switch module control terminal;
    a second capacitor simulation transistor second terminal, coupled to said second switch module control terminal; and
    a second capacitor simulation transistor control terminal, coupled to said second bias control terminal.

25. The PLL circuit according to claim 24, wherein said second switch module comprises:
  a first switch element, comprising:
    a first switch second terminal, coupled to a first predetermined voltage;
    a first switch first terminal, coupled to said second bias second terminal; and
    a first switch control terminal, receiving said up signal; and
  a second switch element, comprising:
    a second switch second terminal, coupled to said first switch first terminal;
    a second switch first terminal, coupled to a second predetermined voltage; and
    a second switch control terminal, coupled to said first switch control terminal and receiving said up signal.

26. The PLL circuit according to claim 24, wherein said second capacitor simulation transistor is in a fully turned on state when said second switch module is turned on by said up signal.

27. The PLL circuit according to claim 24, wherein said second bias transistor and said second capacitor simulation transistor have same transistor specifications.

28. The PLL circuit according to claim 24, wherein said second bias transistor is a P-type metal oxide semiconductor (MOS) transistor, and said second capacitor simulation transistor is a P-type metal oxide semiconductor (MOS) transistor.

29. A PLL circuit, comprising:
  a phase detector, for comparing phases of a reference signal and an output signal to generate an up signal or a down signal;
  a loop filter;
  a charge pump, charging/discharging said loop filter for enabling said loop filter to generate a control voltage, generating an up current to charge said loop filter when receiving said up signal, and drawing a down current from said loop filter to discharge the loop filter when receiving said down signal; and
  a VCO, receiving said control voltage to generate said output signal;
  wherein, said charge pump comprises:
    a connection terminal, coupled to said loop filter, wherein the charging/discharging circuit provides said up current to said loop filter via the connection terminal and draws said down current from said loop filter via the connection terminal;
    a reference current providing module, for providing a reference current;
    a down current module, controlled by said down signal and drawing said down current according to said reference current; and
    an up current module, controlled by said up signal and providing said up current according to said reference current, comprising:
      a switch module, having a switch module control terminal, receiving said up signal at the switch module control terminal to determine whether the switch module is turned on;

a bias transistor, comprising:
  a bias transistor first terminal, coupled to said connection terminal;
  a bias transistor second terminal coupled to said switch module; and
  a bias transistor control terminal coupled to said reference current providing module; and
a capacitor simulation transistor, comprising:
  a capacitor simulation transistor first terminal, coupled to the said switch module control terminal;
  a capacitor simulation transistor second terminal, coupled to said switch module control terminal; and
  a capacitor simulation transistor control terminal, coupled to said bias control terminal.

30. The PLL circuit according to claim 29, wherein said switch module comprises:
a first switch element, comprising:
  a first switch second terminal, coupled to a first predetermined voltage;
  a first switch first terminal, coupled to said bias second terminal; and
  a first switch control terminal, receiving said up signal; and
a second switch element, comprising:
  a second switch second terminal, coupled to said first switch first terminal;
  a second switch first terminal, coupled to a second predetermined voltage; and
  a second switch control terminal, coupled to said first switch control terminal and receiving the said signal.

31. The PLL circuit according to claim 29, wherein said capacitor simulation transistor is in a fully turned on state when said switch module is turned on by said up signal.

32. The PLL circuit according to claim 29, wherein said bias transistor and said capacitor simulation transistor have same transistor specifications.

33. The PLL circuit according to claim 29, wherein said bias transistor is a P-type metal oxide semiconductor (MOS) transistor, and said capacitor simulation transistor is a P-type metal oxide semiconductor (MOS) transistor.

34. The PLL circuit according to claim 29, wherein said reference current providing module is a current mirror, and said bias transistor utilizes said reference current mapped from said reference current providing module as said up current.

* * * * *